United States Patent
Bunce et al.

(10) Patent No.: US 7,023,759 B1
(45) Date of Patent: Apr. 4, 2006

(54) SYSTEM AND METHOD FOR SYNCHRONIZING MEMORY ARRAY SIGNALS

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/054,495

(22) Filed: Feb. 9, 2005

(51) Int. Cl.
*G11C 8/18* (2006.01)

(52) U.S. Cl. ............... 365/230.06; 365/230.03; 365/233; 365/203

(58) Field of Classification Search ........... 365/230.06, 365/233, 203, 230.03
See application file for complete search history.

(56) References Cited

U.S. PATENT DOCUMENTS

| | | | |
|---|---|---|---|
| 5,668,761 A | * | 9/1997 | Muhich et al. ......... 365/189.05 |
| 6,657,886 B1 | * | 12/2003 | Adams et al. ............... 365/154 |
| 6,901,003 B1 | * | 5/2005 | Adams et al. .............. 365/154 |
| 2004/0027885 A1 | | 2/2004 | Buettner et al. ............ 365/200 |

* cited by examiner

*Primary Examiner*—Andrew Q. Tran
(74) *Attorney, Agent, or Firm*—Lynn Augspurger; Cantor Colburn LLP

(57) ABSTRACT

A method of generating access signals for a memory array. The method includes receiving a synchronization signal and generating a wordline select signal in response to the synchronization signal. A local precharge signal is generated in response to the synchronization signal. A precharge signal is generated in response to the synchronization signal, the precharge signal being a row signal for regulating memory array read operations. A write signal is generated in response to the synchronization signal, the write signal being a row signal for regulating memory array write operations.

19 Claims, 4 Drawing Sheets

SYSTEM AND METHOD FOR SYNCHRONIZING MEMORY ARRAY SIGNALS

FIELD OF THE INVENTION

This invention relates to accessing memory arrays, and in particular, relates to synchronizing memory array signals.

BACKGROUND

FIGS. 1A and 1B illustrate a high performance, low power domino SRAM design including multiple local cell groups such as that shown in U.S. Pat. No. 6,657,886, the entire contents of which are incorporated herein by reference. As shown in FIG. 1A, each cell group includes multiple SRAM cells 1-N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to wordline NFETs. A particular WORDLINE is activated, turning on respective wordline NFETs to perform a read or write operation.

As shown in FIG. 1B, the prior art domino SRAM includes multiple local cell groups 1-M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

In order to access a row of memory, a number of signals are needed such as precharge, wordline, etc. There is a need in the art to synchronize generation of these signals from a common point in time to improve access to the memory array.

SUMMARY OF THE INVENTION

Embodiments of the invention include a method of generating access signals for a memory array. The method includes receiving a synchronization signal and generating a wordline select signal in response to the synchronization signal. A local precharge signal is generated in response to the synchronization signal. A precharge signal is generated in response to the synchronization signal, the precharge signal being a row signal for regulating memory array read operations. A write signal is generated in response to the synchronization signal, the write signal being a row signal for regulating memory array write operations.

Embodiments of the invention include a system for generating access signals for a memory array. The system includes a wordline driver generating a wordline select signal in response to a synchronization signal. A buffer generates a local precharge signal in response to the synchronization signal. Precharge logic generates a precharge signal in response to the synchronization signal, the precharge signal being a row signal for regulating memory array read operations. A write driver generating a write signal in response to the synchronization signal, the write signal being a row signal for regulating memory array write operations.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1A:
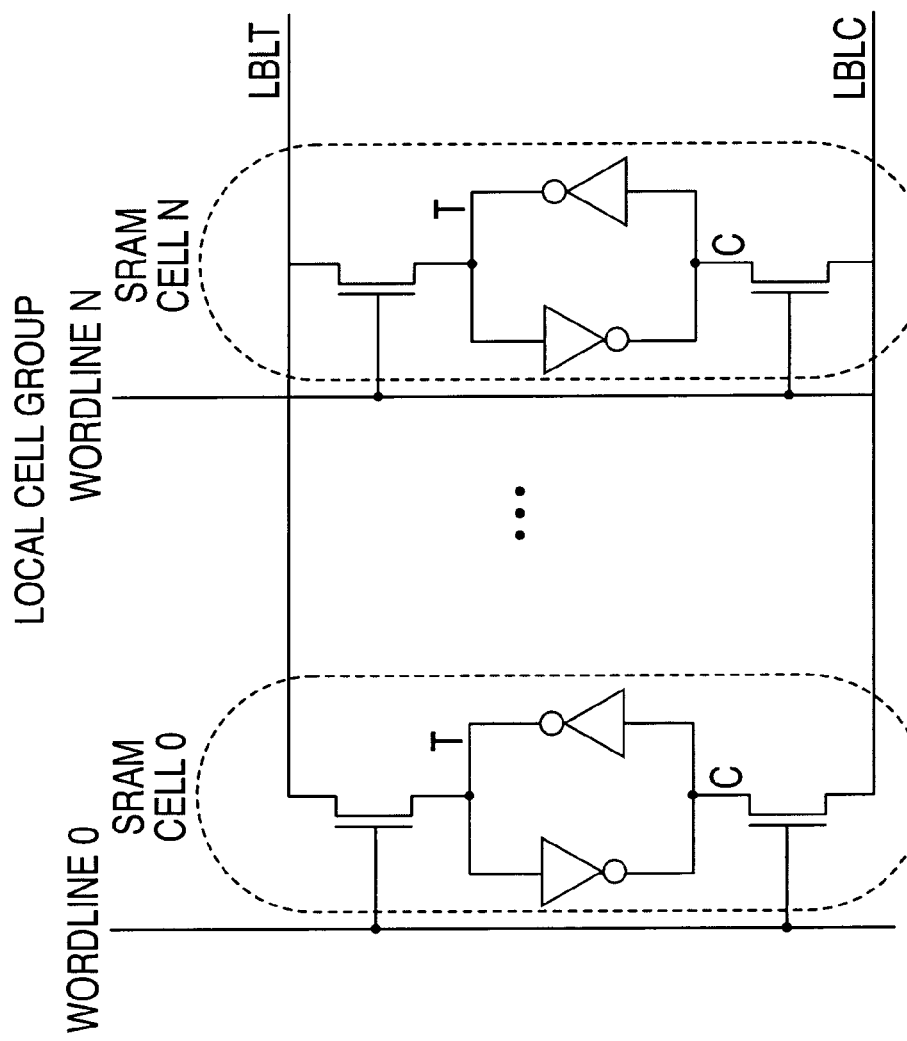
FIG. 1A illustrates an exemplary conventional SRAM cell.
Figure 1B:
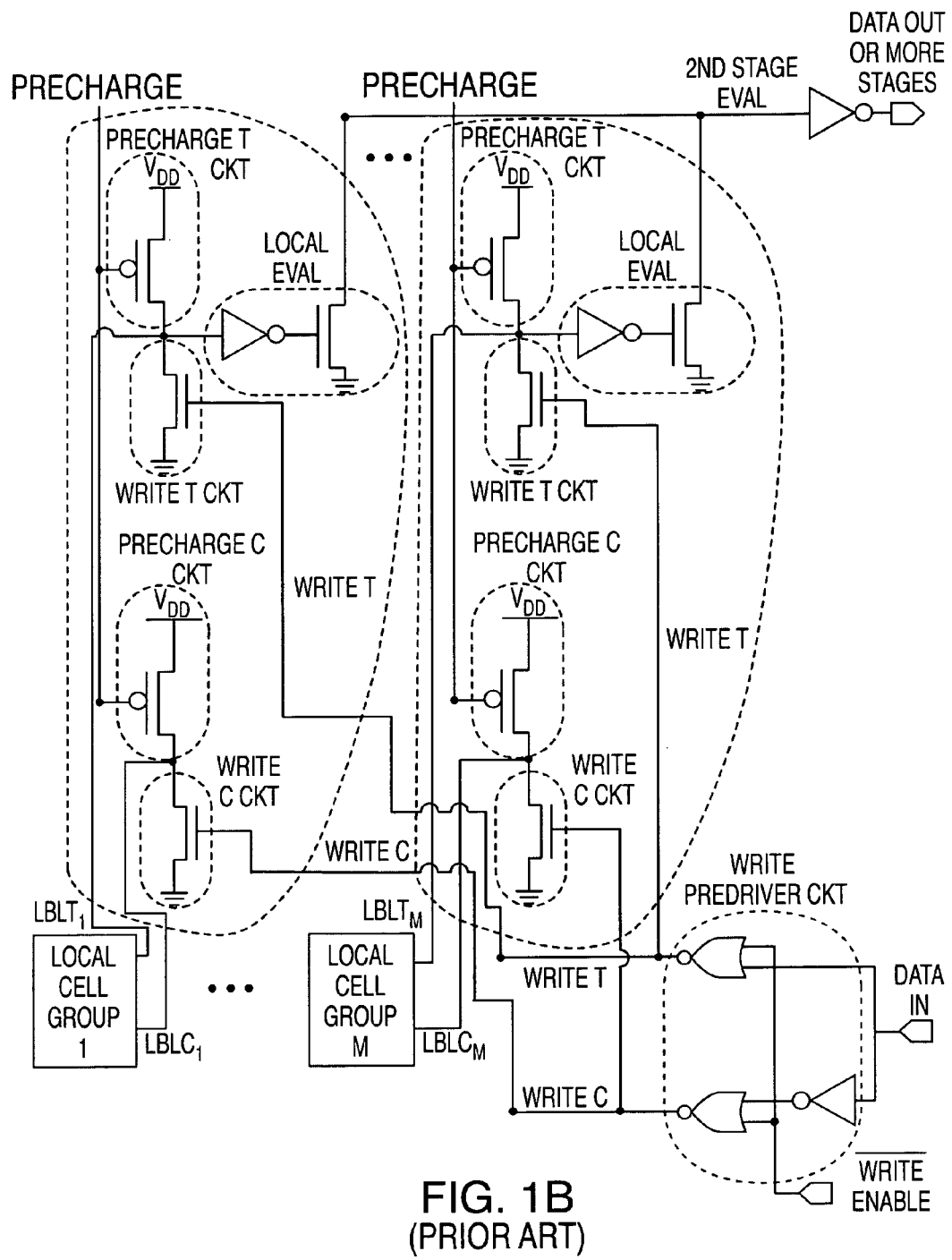
FIG. 1B illustrates an exemplary domino SRAM.
Figure 2:
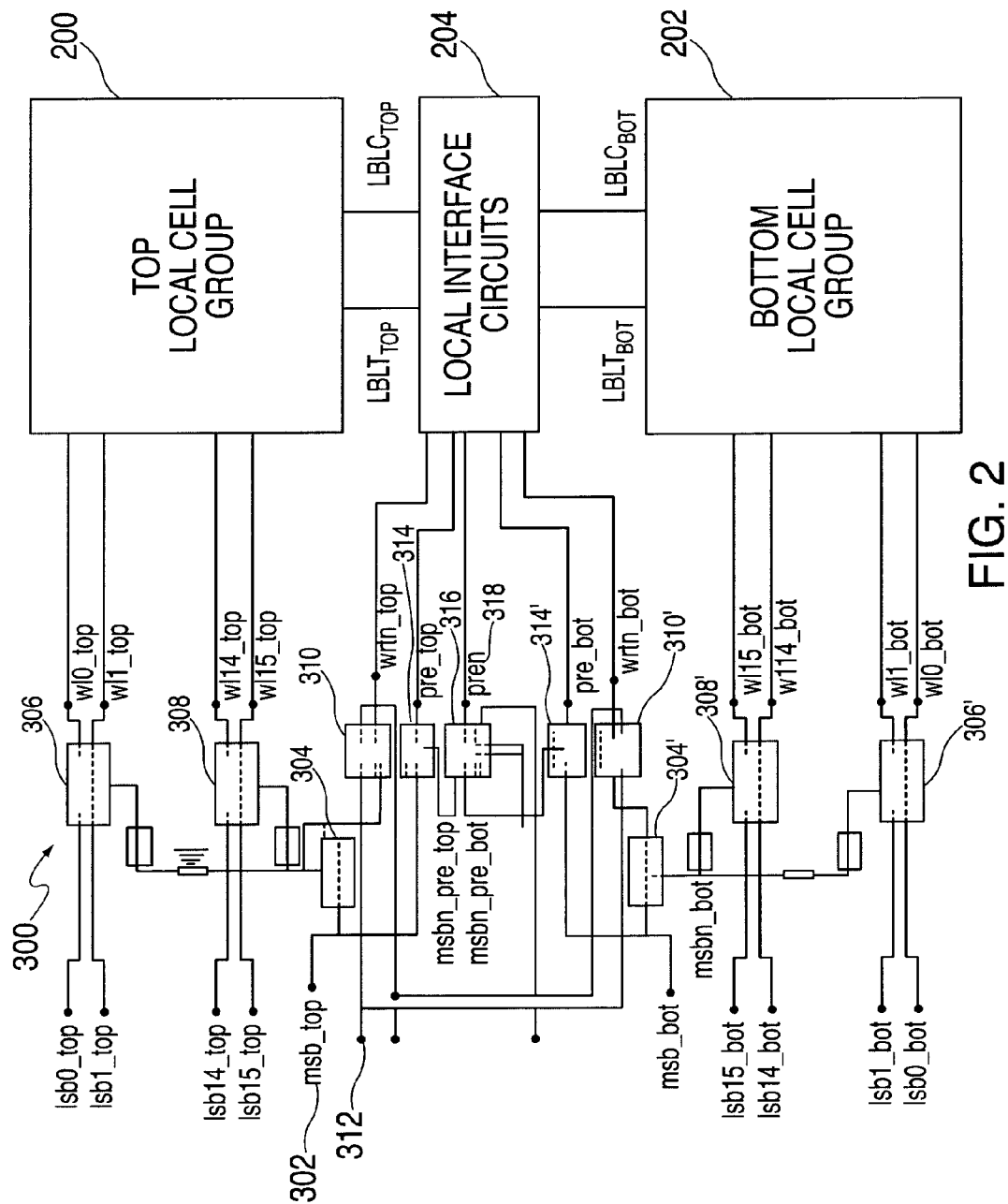
FIG. 2 is a block diagram of a synchronization circuit for use with a memory array.

FIG. 2 is a block diagram of a synchronization circuit 300 for use with a memory array. The synchronization circuit 300 is divided into a top and bottom portion, corresponding to the top local cell group 200 and the bottom local cell group 202 of a memory array that is divided into a top sub-array and a bottom sub-array. Local interface circuits 204 access the top local cell group 200 or the bottom local cell group 202 over bitlines LBLTtop, LBLCtop, LBLThot and LBLCbot.

Operation of the synchronization circuit 300 will be made with reference to the top portion, with corresponding elements in the bottom portion operating in the same manner. The synchronization circuit 300 generates a number of array signals in response to a synchronization signal. In the embodiment of FIG. 2, the synchronization signal is a most significant bit signal 302 labeled msb_top. The most significant bit signal 302 is from a decoded address word.

The most significant bit signal 302 is provided to an inverter 304 that generates the compliment of the most significant bit signal 302, labeled msbn_top. The compliment of the most significant bit signal 302 is provided to word drivers 306 and 308 to enable the generation of wordline select signals output by word drivers 306 and 308. The wordline signal is the row access signal that activates memory cells in top local cell group 200. The wordline drivers 306 and 308 are described in further detail with reference to FIG. 3.

The compliment of the most significant bit signal 302, labeled msbn_top, is also provided to a write driver 310. The write driver 310 generates a write signal based on the compliment of the most significant bit signal 302 and an external write enable signal 312 labeled. The write driver 310 is an AND of a write enable signal 312 with msbn_top. The write driver 310 outputs a write enable signal labeled wrtn_top. The write enable signal is a row signal that enables (e.g., low) or disables (e.g., high) a write operation.

The most significant bit signal 302 is also provided to a buffer 314 that outputs a local precharge signal, labeled pre_top. A low logic level on the local precharge signal precharges the local bitlines to their standby state. A high logic level on the local precharge signal turns off the precharge and allows the bitlines to be driven by the cell (for a read) or a data driver (for a write).

The buffer 314 also outputs a compliment of the most significant bit signal, labeled msbn_pre_top. The compliment of the most significant bit signal is generated by an inverter stage in buffer 314. The compliment of the most significant bit signal is provided to a local precharge logic 316, which generates a precharge NOT signal. The precharge NOT signal is a memory array row signal for regulating read operations. The local precharge logic performs an AND operation between the top compliment of the most significant bit signal and the bottom compliment of the most significant bit signal which is generated at buffer 314'. In an alternate embodiment, the msbn_top signal from inverter 304 is input to the precharge logic 316. This eliminates the need to generate the msbn_pre_top signal.

Figure 3:
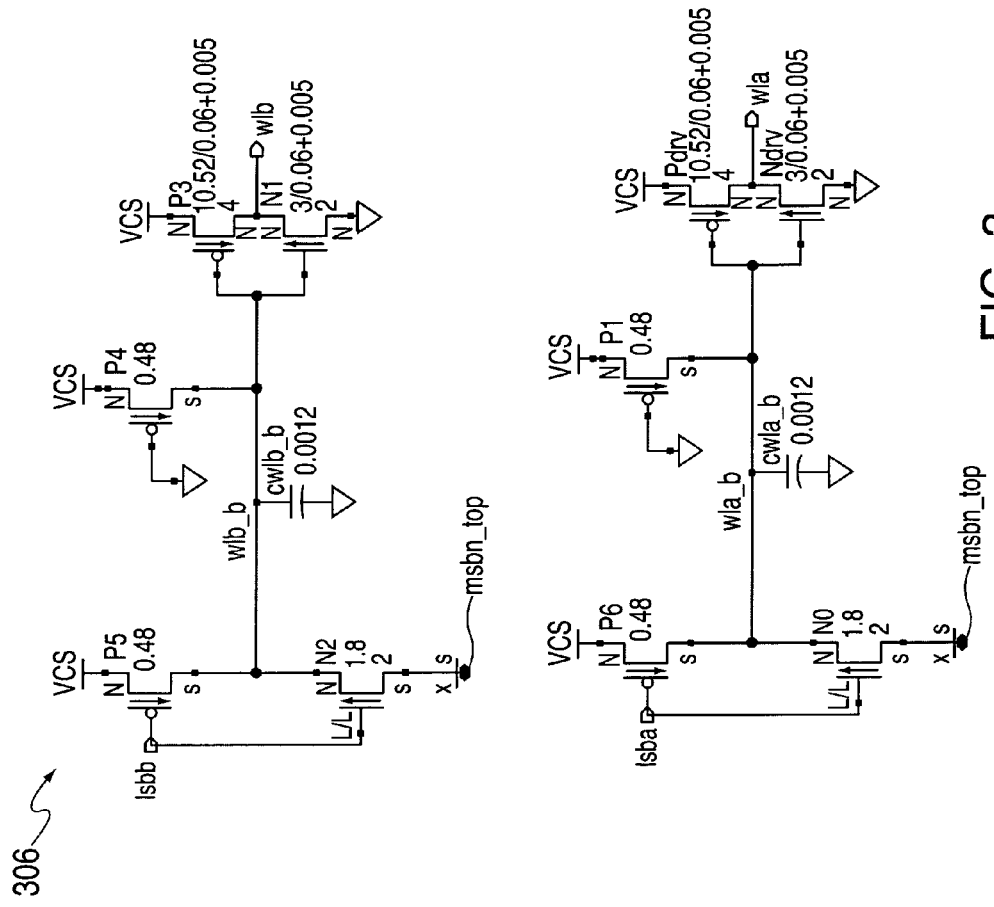
FIG. 3 is a block diagram of wordline driver circuits.

FIG. 3 is a block diagram of wordline driver 306. Wordline driver 308 is composed of similar elements. Wordline driver 306 receives a least significant bit, shown as 1sbb, which is decoded by a series of FETs into a wordline select signal. The compliment of the most significant bit signal is applied to an inverter of the wordline driver 306. When high, the compliment of the most significant bit signal disables generation of a wordline select signal. When low, the compliment of the most significant bit signal drives the source input of the first inverter in the word driver low. This allows for using only a single input (1sb) word decoder in an area that is limited by the height of the memory cell. The wordline driver 306 includes a second stage where least significant bit 1sba is used to generated wordline select w1a in the same manner.

Embodiments of the invention generate sub-array timing signals from a single, common input (e.g., the most significant bit signal). This provides tracking between critical select signals. The precharge NOT signal is generated based on an AND of two local precharge signals. This maintains tight tracking between the local precharge and the precharge NOT signals. By utilizing the common local decode signal (msb) to generate the memory array row access signals (wordline, local precharge, precharge NOT, write NOT), synchronization and tracking of the row access signals is achieved.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of generating access signals for a memory array, the method comprising:
   receiving a synchronization signal;
   generating a wordline select signal in response to the synchronization signal;
   generating a local precharge signal in response to the synchronization signal;
   generating a precharge signal in response to the synchronization signal, the precharge signal being a row signal for regulating memory array read operations; and
   generating a write signal in response to the synchronization signal, the write signal being a row signal for regulating memory array write operations.

2. The method of claim 1 wherein:
   the synchronization signal is a most significant bit signal from a decoded address word.

3. The method of claim 1 wherein:
   the wordline select signal is generated in response to the synchronization signal and a least significant bit signal from a decoded address word.

4. The method of claim 1 wherein:
   the synchronization signal is buffered to generate the local precharge signal.

5. The method of claim 1 wherein:
   the precharge signal is generated in response to a compliment of the synchronization signal.

6. The method of claim 1 wherein:
   the memory array includes two sub-arrays, the synchronization signal corresponding to a first sub-array, a second synchronization signal corresponding to a second sub-array;
   the precharge signal being generated in response to the synchronization signal and the second synchronization signal.

7. The method of claim 6 wherein:
   the precharge signal is generated in response to a logical combination of the synchronization signal and the second synchronization signal.

8. The method of claim 6 wherein:
   the precharge signal is generated in response to a logical combination of the compliment synchronization signal and the compliment second synchronization signal.

9. The method of claim 1 wherein:
   the write signal is generated in response to a compliment of the synchronization signal.

10. The method of claim 1 wherein:
    the wordline select signal and the write signal are generated in response to a first compliment synchronization signal; and
    the precharge signal is generated in response to a second compliment synchronization signal.

11. A system for generating access signals for a memory array, the system comprising:
    a wordline driver generating a wordline select signal in response to a synchronization signal;
    a buffer generating a local precharge signal in response to the synchronization signal;

precharge logic generating a precharge signal in response to the synchronization signal, the precharge signal being a row signal for regulating memory array read operations; and a write driver generating a write signal in response to the synchronization signal, the write signal being a row signal for regulating memory array write operations.

12. The system of claim 11 wherein:

the synchronization signal is a most significant bit signal from a decoded address word.

13. The system of claim 11 wherein:

the wordline select signal is generated in response to the synchronization signal and a least significant bit signal from a decoded address word.

14. The system of claim 11 wherein:

the precharge signal is generated in response to a compliment of the synchronization signal.

15. The system of claim 11 wherein:

the memory array includes two sub-arrays, the synchronization signal corresponding to a first sub-array, a second synchronization signal corresponding to a second sub-array;

the precharge logic generating the precharge signal response to the synchronization signal and the second synchronization signal.

16. The system of claim 15 wherein:

the precharge logic performs a logical combination of the synchronization signal and the second synchronization signal.

17. The system of claim 15 wherein:

the precharge logic performs a logical combination of the compliment synchronization signal and the compliment second synchronization signal.

18. The system of claim 11 wherein:

the write signal is generated in response to a compliment of the synchronization signal.

19. The system of claim 11 further comprising:

an inverter generating a first compliment of the synchronization signal, the wordline driver and the write driver operating in response to the first compliment synchronization signal; and wherein the buffer generates a second compliment synchronization signal, the precharge logic operating in response to the second compliment synchronization signal.

* * * * *